(12) United States Patent
Gong et al.

(10) Patent No.: US 7,911,266 B2
(45) Date of Patent: Mar. 22, 2011

(54) LOW COMPLEXITY AND LOW POWER PHASE SHIFT KEYING DEMODULATOR STRUCTURE

(75) Inventors: Cihun-Siyong Gong, Kaohsiung (TW);
Muh-Tian Shiue, Hsin-chu (TW);
Kai-Wen Yao, Pingtung County (TW)

(73) Assignee: National Central University, Taoyuan County (TW)

( * ) Notice: Subject to any disclaimer, the term of this patent is extended or adjusted under 35 U.S.C. 154(b) by 151 days.

(21) Appl. No.: 12/355,812

(22) Filed: Jan. 19, 2009

(65) Prior Publication Data

US 2010/0182079 A1 Jul. 22, 2010

(51) Int. Cl.
*H03D 3/00* (2006.01)
(52) U.S. Cl. ............... 329/310; 329/304; 375/329
(58) Field of Classification Search ............... 329/310, 329/304; 375/329
See application file for complete search history.

(56) References Cited

U.S. PATENT DOCUMENTS

| | | | | |
|---|---|---|---|---|
| 4,547,738 | A * | 10/1985 | Bayer et al. | 329/310 |
| 4,584,533 | A * | 4/1986 | Huffman | 329/306 |
| 4,704,582 | A * | 11/1987 | Dixon et al. | 329/308 |
| 4,744,094 | A * | 5/1988 | McCarren | 375/327 |
| 5,844,907 | A * | 12/1998 | Uchiki et al. | 370/517 |
| 6,341,146 | B1 * | 1/2002 | Johnson et al. | 375/329 |

* cited by examiner

*Primary Examiner* — Joseph Chang

(57) ABSTRACT

A low complexity and low power phase shift keying demodulator structure includes a digitizer, a phase-transition-independent carrier clock extractor, a binary correlater, a delay element, and a sampler. The digitizer digitizes a BPSK signal for an output waveform. The phase-transition-independent carrier clock extractor detects the phase transition on the output of the digitizer and produces a carrier clock signal. The binary correlater has correlated processes to the output signal of the digitizer and carrier clock signal obtained from the phase-transition-independent carrier clock extractor. The sampler samples the signal from the binary correlater according to the signal from the delay element in order to finish the demodulation with only a small capacitance.

9 Claims, 2 Drawing Sheets

LOW COMPLEXITY AND LOW POWER PHASE SHIFT KEYING DEMODULATOR STRUCTURE

BACKGROUND OF THE INVENTION

1. Field of the Invention

The present invention generally relates to a demodulator structure and, more particularly, to a low complexity and low power phase shift keying demodulator structure.

2. Description of the Prior Art

Generally speaking, wireless powering systems or high receiving signal-to-noise ratio systems for the low industry, the science and medical science (ISM) band, mostly adopt the amplitude shift keying (ASK) technique. Despite the ASK demodulator structure being convenient to implement in practice, according to references 1 and 2, the demodulation way of the ASK using the envelope detection may cause the demodulator to be poor in area efficiency for the systems applied to the low ISM band.

Besides, the modulation/demodulation of the ASK may not implement the wireless transmission with a high data rate, which is only suitable for applications where data rate is of secondary importance. For those wireless systems adopting low ISM band and requiring high-data-rate transmission, such as some implantable biomedical applications, the frequency-shift keying demodulator submitted by reference 3 is another option. The technology in reference 3 gets rid of the high cost defect caused by the ASK demodulation, but the energy efficiency of the wireless transmission is compromised instead. As a result, the overall efficiency of the wireless powering system is tremendously affected.

A phase shift keying (PSK) demodulator has been submitted by reference 4. Although the PSK technique possesses higher efficiency compared to the frequency shift keying (FSK) and ASK counterparts, the receiver must have a precise reference signal in order to estimate an unknown phase and recover correct information while obtaining the phase offset. Among the PSK demodulation techniques, the Costas loop is the most realistic method. All the PSK demodulation techniques including the Costas loop require employing the closed-loop techniques, such as a phase-locked loop for carrier recovery, resulting in significant complexity.

Further, if the demodulator uses the phase-locked loop, the power consumption and implementation area of the system will considerably increase. Motivated by the limited power budget for the wireless applications mentioned above, a differential phase shift keying (DPSK) structure has been submitted by reference 5. Although the structure uses the differential coding to eliminate the demand of the closed-loop techniques such as the phase-locked loop, the structure still suffers from the problems of complexity and power consumption. Moreover, for the structure in reference 5, correct demodulation still relies on the clock signal generated by the oscillator. Owing to the phase drifting of the oscillator stemming from device imperfection, an additional compensation circuit may be needed, resulting in increase in complexity. In addition, to achieve the same bit error rate, the DPSK structure is worse in the aspect of power efficiency as compared to the binary phase shift keying (BPSK) counterpart.

Apparently, there seems to be no satisfactory breakthrough in making a better compromise between the power efficiency and implementation area. Therefore, overcoming the disadvantages of the prior arts has been of primary importance to the skilled people in the related field.

Following is the reference list:

[1] P. Mohseni and K. Najafi, "A 1-MHz, 5-Kb/s Wireless Command Receiver for Electronic Site Selection in Multichannel Neural Biopotential Recording," Proc. IEEE 28th EMBS Conf., pp. 6241-6244, August 2006.

[2] H. Yu and R. Bashirullah, "A Low Power ASK Clock and Data Recovery Circuit for Wireless Implantable Electronics," Proc. IEEE Custom Intergrated Circuits Conf. (CICC), pp. 249-252, September 2006.

[3] M. Ghovanloo and K. Najafi, "A wideband frequency-shift keying wireless link for inductively powered biomedical implants," IEEE Trans. Circuits and Systems I: Regular Papers, vol. 51, pp. 2374-2383, December 2004.

[4] Y. Hu and M. Sawan, "A fully integrated low power BPSK demodulator for implantable medical devices," IEEE Trans. Circuits and Systems I: Regular Papers, vol. 52, pp. 2552-2562, December 2005.

[5] Zhou, M., Liu, W., Wang, G., Sivaprakasam, M., Yuce, M. R., Weiland, J. D., and Humayun, M. S., "A transcutaneous data telemetry system tolerant to power telemetry interference," Proc. IEEE 28th EMBS Conf., 2006, pp. 5884-5887.

[6] Al-Sarawi, S. F., "Low power Schmitt trigger circuit," Electron. Lett., 2002, 38, pp. 1009-1010.

[7] Wang, G., Liu, W., Sivaprakasam, M., Zhou, M., Weiland, J. D., and Humayun, M. S., "A wireless phase shift keying transmitter with Q-Independent phase transition time," Proc. IEEE 27th EMBS Conf., 2005, pp. 5238-5241.

SUMMARY OF THE INVENTION

The disadvantages of the prior arts to be solved are listed below:

1. The prior PSK demodulator structures applied to the low ISM band mostly adopt the phase-locked loop, etc. to perform carrier recovery. Therefore, they are full of the disadvantages of high complexity and high implementation cost.

2. The prior PSK demodulator structures, applied to the low ISM band, adopt the phase-locked loop to estimate the phase offset of the carrier in only the received signal and track it properly, resulting in considerable power consumption and degrading the power efficiency of the system. Accordingly, the DPSK structure was then submitted. Although the structure uses the differential coding to eliminate the demand of the closed-loop techniques such as the phase-locked loop, the structure still suffers from the problems of complexity and power consumption. For the prior structure, correct demodulation still relies on the clock signal generated by the oscillator. Owing to the phase drifting of the oscillator stemming from device imperfection, an additional compensation circuit may be needed, resulting in increase in complexity.

The present invention provides a low complexity and low power phase shift keying demodulator structure to overcome the aforesaid disadvantages. It comprises: a digitizer, which inputs a binary phase shift keying signal (BPSK Signal) and then digitizes the BPSK signal for an output waveform; a phase-transition-independent carrier clock extractor, which comprises a discharge path controlled by a power-on-reset signal, with the discharge path assuring the phase shift keying demodulator of a proper operation; and a capacitance load path controlled by a performance analyzer signal, with the capacitance load path providing a compensation mechanism to the circuits of the demodulator while they are effected by process variation. The performance analyzer signal decides whether the capacitance load path is electrified. The performance analyzer is electrically connected to a power end or a reference ground end without any specific bias before the demodulator is actually used. The phase-transition-independent carrier clock extractor is connected to the digitizer and detects the phase transition on the output of the digitizer. A binary correlater is individually and electrically connected to the digitizer and phase-transition-independent carrier clock extractor and has correlated processes to the output signal of the digitizer and carrier clock signal obtained from the phase-transition-independent carrier clock extractor. A delay element is electrically connected to the phase-transition-independent carrier clock extractor and receives and processes the carrier clock signal from the phase-transition-independent carrier clock extractor. A sampler is individually and electrically connected to the binary correlater and delay element and samples the signal from the binary correlater according to the signal from the delay element in order to finish the demodulation.

Thus, the advantages of the present invention are as follows:

1. The present invention may demodulate the BPSK signal without the closed-loop techniques, such as the phase-locked loop, etc. when applied to the wirelessly powered and high receiving signal-to-noise ratio systems specifically designed for a low ISM band.

2. The present invention may not need additional circuits to compensate the phase drifting of the oscillator of the prior PSK structure, so as to achieve low complexity, low implementation cost and low power consumption.

BRIEF DESCRIPTION OF THE DRAWINGS

The spirits and advantages of the preferred embodiments of the present invention will be readily understood by the accompanying drawings and detailed descriptions, wherein.

DETAILED DESCRIPTION OF THE INVENTION

Figure 1:
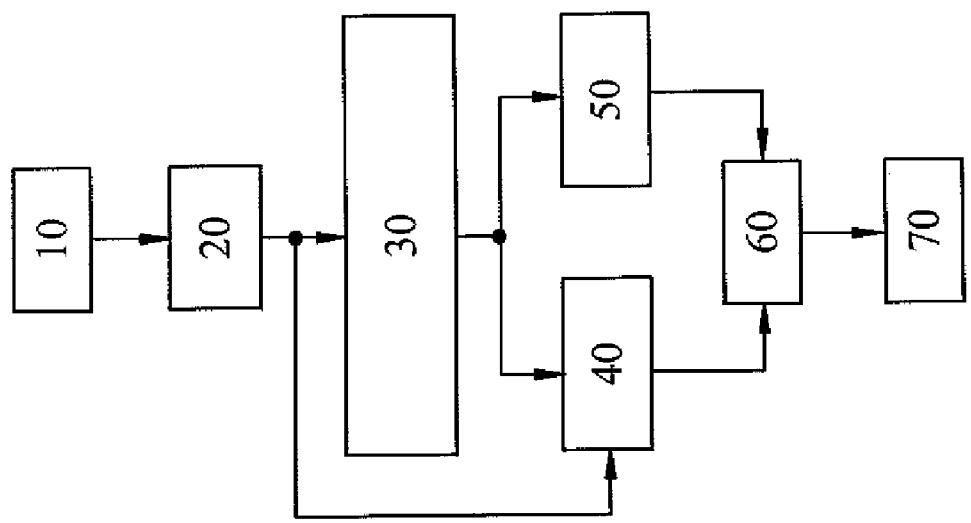
FIG. 1 illustrates a flow chart of a preferred embodiment of the low complexity and low power phase shift keying demodulator structure of the present invention.
Figure 2:
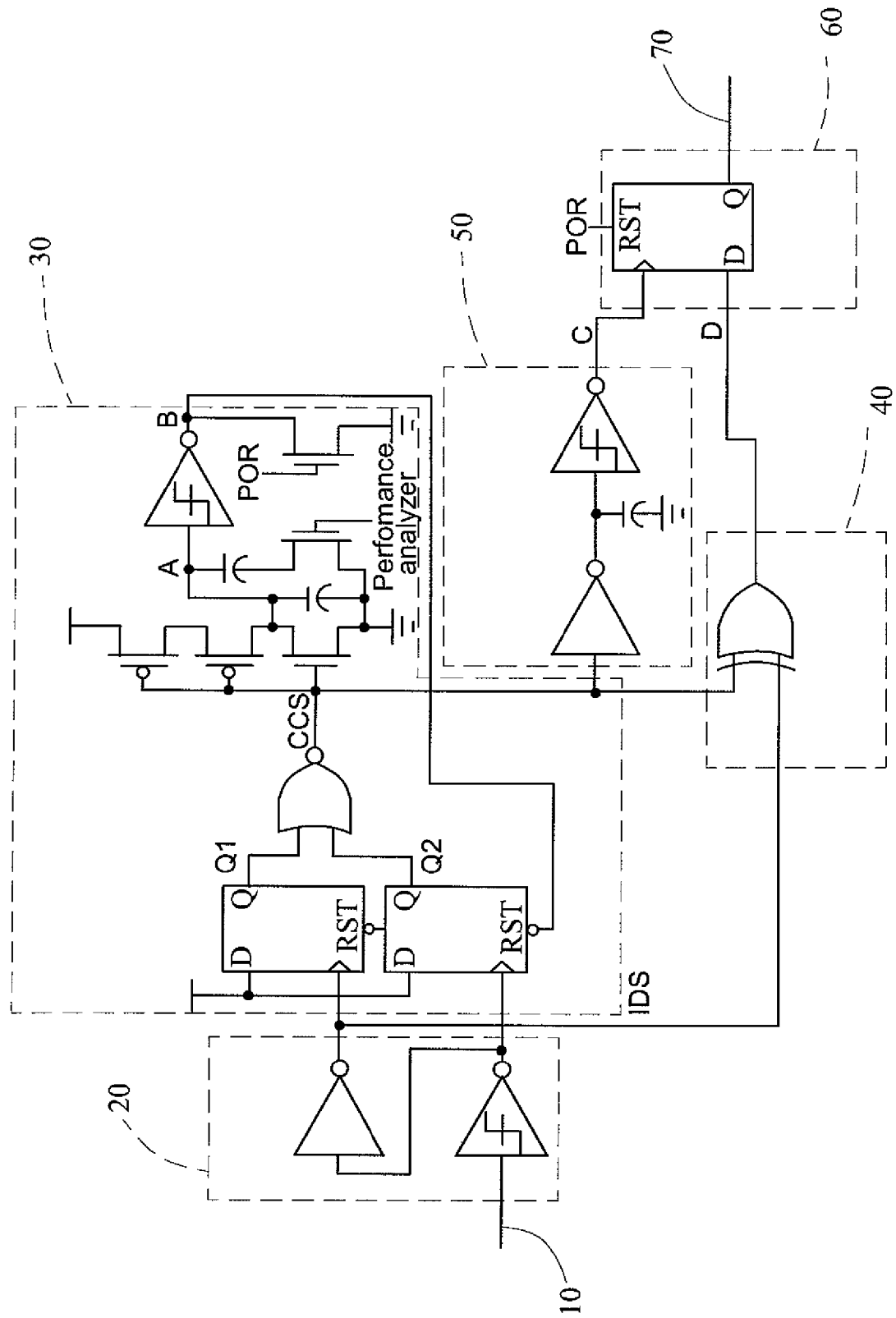
FIG. 2 illustrates a schematic view of circuits of the preferred embodiment of the low complexity and low power phase shift keying demodulator structure of the present invention.

FIG. 1 and FIG. 2 illustrate a flow chart of the preferred embodiment of the low complexity and low power phase shift keying demodulator structure of the present invention and a schematic view of the circuits of the preferred embodiment of the low complexity and low power phase shift keying demodulator structure of the present invention. The phase shift keying demodulator structure includes: a digitizer 20, a phase-transition-independent carrier clock extractor 30, a binary correlater 40, a delay element 50, and a sampler 60. The digitizer 20 inputs a binary phase shift keying signal (BPSK signal) 10 and then digitizes the BPSK signal 10 for an output waveform. The phase-transition-independent carrier clock extractor 30 includes a discharge path controlled by a power-on-reset signal POR. The discharge path assures the phase shift keying demodulator of a proper operation. A capacitance load path is controlled by a signal from a performance analyzer, such as marketed by INTEL™ under the trademark Vtune™. The capacitance load path provides a compensation mechanism to the circuits, while the circuits are effected by process variation. The performance analyzer signal decides whether the capacitance load path is electrified. The performance analyzer is electrically connected to a power end or a reference ground end without any specific bias before the demodulator is actually used. The phase-transition-independent carrier clock extractor 30 is connected to the digitizer 20 and detects the phase transition on the output of the digitizer 20.

The binary correlater 40 is individually and electrically connected to the digitizer 20 and phase-transition-independent carrier clock extractor 30 and has correlated processes to the output signal of the digitizer 20 and carrier clock signal obtained from the phase-transition-independent carrier clock extractor 30. The delay element 50 is electrically connected to the phase-transition-independent carrier clock extractor 30 and receives and processes the carrier clock signal from the phase-transition-independent carrier clock extractor 30. The sampler 60 is individually and electrically connected to the binary correlater 40 and delay element 50 and samples the signal from the binary correlater 40 according to the signal from the delay element 50 in order to obtain a demodulated output 70.

The digitizer 20 includes a Schmitt trigger and an inverter.

The digitizer 20 includes a circuit having a hysteresis function and an inverter.

The phase-transition-independent carrier clock extractor 30 includes two D-type flip-flops, one NOR gate, two P-type transistors, three N-type transistors, two capacitors, and one Schmitt trigger.

The phase-transition-independent carrier clock extractor 30 includes a circuit having a hysteresis function.

The binary correlater 40 includes an exclusive-OR gate.

The delay element 50 includes an inverter, a capacitor, and a Schmitt trigger.

The delay element 50 includes a circuit having a hysteresis function.

The sampler 60 includes a D-type flip-flop.

Further, BPSK signal 10 input to the phase shift keying demodulator structure may pass through the digitizer 20 firstly. The digitizer 20 digitizes the input BPSK signal 10 for the output waveform and includes a Schmitt trigger circuit with the hysteresis function and an inverter. The circuit with the hysteresis function may avoid the situation that the output of the digitizer 20 is affected by the noises of the BPSK signal 10, so that the output waveform may not be with glitch, but with a better noise margin.

The output result of the digitizer 20 is an inphase digital signal (IDS) on the output node and may be fed into the phase-transition-independent carrier clock extractor 30. The partial circuits are modified from the data/clock separator of ref. 1. The modified circuits replace the high-complexity and high-power-consumption circuits, such as the circuits of the phase-locked loop, in the prior arts. Hence, the present invention has the advantages of low power and small area. The theory for the phase-transition-independent carrier clock extractor 30 is described as follows: A power-on-reset pulse (POR) in FIG. 2 is produced through a power-on-reset circuit of a receiver or a system while the provided power supply approaches a predefined voltage. The power-on-reset circuit is a must for all integrated circuit systems as always, and it will not be described any further hereinafter.

Producing the POR may reset Q1 and Q2 in FIG. 2 to the status of logic low as a lowest reference level around zero voltage. Q1 and Q2 are the outputs of the two D-type flip-flops. The node carrier clock signal (CCS) in FIG. 2 is changed to the status of logic high as a highest reference level around the supply voltage of the demodulator. Then, the two D-type flip-flops detect the phase transition on the inphase digital signal (IDS) which is the output node of the digitizer 20.

Once the IDS, the output node of the digitizer 20, has the situation of the phase transition, the CCS in FIG. 2 may be dragged to the status of logic low. Then, the node A in FIG. 2 is charged so as to gradually increase the voltage level thereof. Before that node A approaches the switching point of the output level, the level of the node B of FIG. 2, of the Schmitt trigger, that is, before the level of the node B of FIG. 2 is switched from the status of logic high to the status of logic low, any switch happening on the IDS, the output node of the digitizer 20, may not cause the malfunction of the phase-transition-independent carrier clock extractor 30.

While the voltage level of the node A is charged to let the level of the node B in FIG. 2 be switched from the status of logic high to the status of logic low, Q1 and Q2 may be reset to the status of logic low. The phase-transition-independent carrier clock extractor 30 then starts to detect the next phase transition of the IDS on the output node of the digitizer 20.

The rising time of the signal on the node A should be greater than 0.5 carrier period and smaller than one carrier period. Thus, the CCS of the node may be generated correctly. With the comparisons of the phase-transition-independent carrier clock extractor 30 and the partial circuits of the data/clock separator of reference 1, a capacitive load path is added between the node A and the ground which is defined as the lowest level of the whole circuits. The capacitance load path whose effectiveness is subject to the performance analyzer assures the demodulator of a proper operation while the demodulator suffers from extreme process and temperature variations. The performance analyzer may be either connected to the power source (the highest level) of the whole circuits or the reference ground end (the lowest level) before the demodulator or a system with the demodulator is truly applied or electrified. As a result, there is no need to add specific bias for such a demodulator.

The binary correlater 40 functions as a mixer and inputs the IDS on the output node of the digitizer 20 and the CCS of the phase-transition-independent carrier clock extractor 30 for the aforesaid correlated processes. Due to the IDS and CCS being digitalized, the binary correlater can be formed with an exclusive-OR gate.

The extracted CCS in FIG. 2 passes the delay element 50, and the output signal on the node D of the binary correlater 40 is sampled according to the signal on the node C generated by the delay element 50 so as to eliminate the disadvantage of the conventional designs applied to the low ISM band that uses a large capacitor to achieve the effect of low-pass filter. Therefore, the present invention may need only a small capacitance value to approach the above objectives, saving the area overhead and further reducing the cost for circuit implementation. The sampling process is executed by the sampler in FIG. 2.

The capacitance value of the delay element 50 should be carefully estimated. The sampling may not appear at the moment where the output signal of the binary correlater 40 on the node D goes through the zero crossing point. Thus, the present invention may have the signal 70 generated by the demodulator without the preamble circuits in reference 5 and avoids the problem of the phase drifting of the oscillator of the design in reference 5.

For analyzing results and making comparison, the present invention is tested and verified through a 0.18-μm CMOS process of the Taiwan Semiconductor Manufacturing Company Limited (TSMC). It should be noted that the process applicability of the structure may not be restricted. Other processes may also be applied for the purpose of the verification. Comparing to the off-the-shelf consumer electronics products and assemblies of the non-wireless-powering systems, lowering the power consumption to the wireless powering system is much more important than that to the non-wireless-powering system. The present invention adopts the Schmitt trigger circuit in reference 6 to have all the Schmitt triggers in FIG. 2 for verification in order to eliminate the worse power efficiency caused by the larger short-circuit current of the prior Schmitt trigger.

In addition, to completely verify the performance of applying the present invention to the wireless powering system, the present invention further adopts the wireless PSK transmitter in reference 7 for verification. Following is the table 1 representing the comparison of the performance summary of the BPSK demodulator and those of the references.

| Reference | Modulation Technique | Carrier Frequency (MHz) | Data-Rate-to-Carrier-Frequency Ratio◆ | Demodulator Area (mm²)/ Process (μm) | Power Consumption (mW) |
|---|---|---|---|---|---|
| [1] | ASK | 1 | 0.005 | —/1.5 | 0.354@ ± 1.5 V |
| [2] | ASK | 2.64 | 0.0025 | —/0.5 | — |
| [3] | FSK | 10/5 | 0.25 (DFSK)✕ | 0.29/1.5 | 0.38@5 V |
| [4] | BPSK | 10 | 0.112 | 0.19/0.18 | 0.61@5 V |
| [5]★ | DPSK | 20 | 0.1 | — | 6 |
| Present Invention | BPSK | 4 | 0.2 | 0.0043/0.18 | <0.059@1.8 V |

"✕": offering the best performance on the demodulators proposed by the authors
"—": not available in terms of pure demodulator
"★": simulation
"◆": according to ref. 3

In table 1, the simplified nouns are described as follows:
ASK: amplitude shift keying;
FSK: frequency shift keying;
DFSK: double frequency shift keying;
DPSK: differential phase shift keying;
BPSK: binary phase shift keying Please note that the carrier frequency of the present invention is set as 4 Mhz according to specific requirements, but it is not restricted by the value of 4 Mhz and may be flexible according to different needs. Moreover, for the Data-Rate-to-Carrier-Frequency Ratio in table 1, the present invention is restricted by the transceiver, but not the demodulator itself. According to table 1, not only the area of the demodulator is better than the references, but also the efficiency is enhanced.

Although this invention has been disclosed and illustrated with reference to particular embodiments, the principles involved are susceptible for use in numerous other embodiments that will be apparent to persons skilled in the art. This invention is, therefore, to be limited only as indicated by the scope of the appended claims.

What is claimed is:

1. A low complexity and low power phase shift keying demodulator comprising:

a digitizer, which inputs a binary phase shift keying signal (BPSK Signal) and then digitizes the BPSK signal for an output waveform;

a phase-transition-independent carrier clock extractor, which comprises a discharge path controlled by a power-on-reset signal, the discharge path assuring the phase shift keying demodulator of a proper operation; and a capacitance load path controlled by a signal of a performance analyzer, the capacitance load path providing a compensation mechanism to circuits of the phase shift keying demodulator effected by process variation, the performance analyzer signal decides whether the capacitance load path is electrified, the performance analyzer is electrically connected to a power end or a reference ground end without any specific bias before the phase shift keying demodulator is actually used, the phase-transition-independent carrier clock extractor being connected to the digitizer and detecting phase transition on the output waveform of the digitizer;

a binary correlater, which is individually and electrically connected to the digitizer and phase-transition-independent carrier clock extractor and has correlated processes to the output waveform of the digitizer and a carrier clock signal obtained from the phase-transition-independent carrier clock extractor;

a delay element, which is electrically connected to the phase-transition-independent carrier clock extractor and receives and processes the carrier clock signal from the phase-transition-independent carrier clock extractor; and a sampler, which is individually and electrically connected to the binary correlater and delay element and samples a signal from the binary correlater according to a signal from the delay element in order to finish demodulation.

2. The low complexity and low power phase shift keying demodulator structure according to claim 1, wherein the digitizer comprises one Schmitt trigger and one inverter.

3. The low complexity and low power phase shift keying demodulator structure according to claim 1, wherein the digitizer comprises one circuit having a hysteresis function and one inverter.

4. The low complexity and low power phase shift keying demodulator structure according to claim 1, wherein the phase-transition-independent carrier clock extractor comprises two D-type flip-flops, one NOR gate, two P-type transistors, three N-type transistors, two capacitors, and one Schmitt trigger.

5. The low complexity and low power phase shift keying demodulator structure according to claim 1, wherein the phase-transition-independent carrier clock extractor comprises one circuit having a hysteresis function.

6. The low complexity and low power phase shift keying demodulator structure according to claim 1, wherein the binary correlater comprises one exclusive-OR gate.

7. The low complexity and low power phase shift keying demodulator structure according to claim 1, wherein the delay element comprises one inverter, one capacitor, and one Schmitt trigger.

8. The low complexity and low power phase shift keying demodulator structure according to claim 1, wherein the delay element comprises one circuit having a hysteresis function.

9. The low complexity and low power phase shift keying demodulator structure according to claim 1, wherein the sampler comprises one D-type flip-flop.

* * * * *